United States Patent [19]
Schneegans et al.

[11] Patent Number: 5,993,908
[45] Date of Patent: Nov. 30, 1999

[54] METHOD OF PRODUCING AN ALUMINUM FILM

[75] Inventors: Manfred Schneegans, Vaterstetten; Stefan Dietrich, Türkenfeld; Alexander Hirsch, Ottobrunn, all of Germany

[73] Assignee: Siemens Aktiengesellschaft, Munich, Germany

[21] Appl. No.: 08/864,277

[22] Filed: May 28, 1997

[30] Foreign Application Priority Data

May 28, 1996 [DE] Germany .......................... 196 21 400

[51] Int. Cl.$^6$ ............................... B05D 3/02; B05D 5/12
[52] U.S. Cl. ................................ 427/374.1; 427/374.3; 427/383.3; 427/96; 427/124; 427/250; 427/566; 427/409; 204/192.17; 438/660; 438/927
[58] Field of Search .................................. 427/250, 409, 427/566, 96, 124, 374.1, 374.3, 383.3; 204/192.17; 438/660, 927

[56] References Cited

U.S. PATENT DOCUMENTS

| | | |
|---|---|---|
| 3,830,657 | 8/1974 | Farrar ...................................... 117/217 |
| 3,848,330 | 11/1974 | Hall et al. . |
| 4,566,177 | 1/1986 | van de Ven et al. . |
| 5,300,307 | 4/1994 | Frear et al. . |
| 5,565,707 | 10/1996 | Colgan et al. .......................... 256/762 |
| 5,597,458 | 1/1997 | Sanchez, Jr. et al. ............... 204/192.3 |

OTHER PUBLICATIONS

"The Role of Cu Distribution and Al$_2$CU Precipitation on the Electromigration Reliability of Submicrometer Al(Cu) Lines", J. Appl. Phys. 75(7), dated Apr. 1, 1994, pp. 3432–3434.

"Comparison of Mechanical Properties and Microstructure of Al(1 wt.%Si) and Al(1wt.%Si, 0.5 wt. % Cu) thin Films" (Bader et al.), 1995 Elsevier Science, Thin Solid Films, pp. 175–184; No month data!.

"The Effect of Cu Alloying on Al Alloy Thim Films: Microstructural Mechanisms that enhance Electromigration Resistance" (Frear et al.), Microelectronics III Symposium, San Francisco, CA, Apr. 1993, pp. 349–367.

"The Evolution of Microstructure in Al–2 Pct Cu Thin Films: Precipitation, Dissolution, and Reprecipitation" (Prear et al.), vol. 21 A, Sep. 1990, pp. 2449–2459.

"Materials Reliability in Microelectronics III" (Rodbell), Mat. Res. Soc Symp. Proc. vol. 309, 1993 Materials Research Society, pp. 384–394 No month data!!.

*Primary Examiner*—Roy V. King
*Attorney, Agent, or Firm*—Herbert L. Lerner; Laurence A. Greenberg

[57] ABSTRACT

A method of producing an aluminum film on a substrate, from which very narrow aluminum conductor tracks can be created that are highly resistant to electromigration and/or stress migration. The substrate with the polycrystalline aluminum film is cooled in an oven in a controlled fashion from a target temperature to a final temperature such that energetically stable Al$_2$Cu-θ-phases are formed directly among the individual aluminum grains in the aluminum film. The cooling is controlled such that the instantaneous temperature passes through a predetermined temperature profile. Within the range of 320° C. to 200° C., the cooling gradient is less than 6° C. per hour.

12 Claims, No Drawings

METHOD OF PRODUCING AN ALUMINUM FILM

BACKGROUND OF THE INVENTION

FIELD OF THE INVENTION

The invention relates to a method of producing an aluminum film on a substrate.

Aluminum has been the metal used nearly exclusively for conductor tracks in semiconductor technology, because it is very well able to meet the demands made of such conductor tracks.

However, aluminum also has several negative properties, the effects of which have not yet been completely eliminated.

One of these particularly negative properties is the pronounced electromigration in aluminum conductor tracks. The term electromigration is understood to mean the migration of material in conductor tracks under the influence of an electric current. Because of the impacts of moving electrons against the positively charged aluminum core of the crystal lattice, a depletion of material in the direction of the electron flux takes place. This depletion of material can cause a complete local interruption of a conductor track and hence the total failure of an integrated circuit.

A further phenomenon, namely so-called stress migration, can also occur in aluminum conductor tracks. This is understood to mean the migration of aluminum atoms under the influence of internal mechanical stresses at elevated temperature. Stress migration, too, can ultimately lead to an interruption of a conductor track and thus to the total failure of an integrated circuit.

The art has found that the addition of approximately 0.5 to 5% by weight of copper to the aluminum is a viable defense against stress migration and electromigration.

With very narrow aluminum conductor tracks (width $\leq 1$ $\mu$m) in very large scale integrated circuits, however, cracks and interruptions in the conductor tracks are found despite the aforementioned alloy addition of copper. The cracks and line breaks occur ever more often, even without any current load, and after passive temperature storage at low temperatures (125° C.).

Multilayer metallizings with $SiO_2$ dielectrics as underlays and $SiO_2/SiN_x$ cover layers in the upper metal levels are especially affected. The reason for this are the very strong extrinsic tensile stresses that occur there. They have been found to be caused by the later gaplike cracking of the aluminum conductor tracks in the cooling phase of the annealing process or in the polyimide cross-linking. The process-dictated cooling characteristic there has the effect that during the cooling, flat copper islets are formed—so-called Guinier-Preston phases—in the grown aluminum grains. In the previously conventional cooling phases, the copper atoms migrate out of the interior of the aluminum grains to the grain boundaries, where they convert into the stable $Al_2Cu$-$\theta$-phases. They leave behind open lattice planes or lattice planes that are greatly disturbed by offsets. These disturbed planes cannot be entirely cured by the aluminum atoms.

SUMMARY OF THE INVENTION

It is accordingly an object of the invention to provide a method of producing an aluminum film, which overcomes the above-mentioned disadvantages of the heretofore-known devices and methods of this general type and which avoids these open lattice planes, greatly impeded by offsets, inside the aluminum grains.

With the foregoing and other objects in view there is provided, in accordance with the invention, a method of producing an aluminum film on a substrate, which comprises:

a) depositing a polycrystalline aluminum film with 0.5 to 5% by weight of copper on a substrate;

b) placing the substrate with the polycrystalline aluminum film in an oven and heating to a given target temperature;

c) subsequently cooling the substrate with the polycrystalline aluminum film in the oven from the target temperature to a final temperature, and forming energetically stable $Al_2Cu$-$\theta$-phases directly between individual aluminum grains in the polycrystalline aluminum film.

The cooling is preferably effected, particularly in the range between approximately 320° C. and 200° C., at less than 6° C. per hour. The instantaneous temperature of the substrate with the polycrystalline aluminum film thereby passes through a predetermined temperature profile.

The invention is based on the understanding that the energetically stable $Al_2Cu$-$\theta$-phases can be formed directly from the composite (mixed) phases in the particle boundaries between aluminum grains by means of a temperature maturation process. The intervening formation of Guinier-Preston phases is thus omitted. The out-diffusion of the unstable, large-surface copper sediments (islets) from the interior of the aluminum grains is dispensed with, and no lattice gaps such as empty or offset planes form after the temperature maturation process.

In accordance with an added mode of the invention, the substrate with the polycrystalline aluminum film is annealed (tempered) at the target temperature of approximately 450° C.

In accordance with another feature of the invention, the process further includes applying an imide film on the aluminum film, and polymerizing the imide film at a target temperature of approximately 360° C.

After the annealing step and/or the polymerizing step have been performed, the process continues with the controlled cooling step through the predetermined temperature profile in the temperature range from 320° C. to 200° C. The temperature change is thereby less than 6° C. per hour.

In accordance with another feature of the invention, the step of depositing the polycrystalline aluminum film comprises sputtering at a temperature of, for example, 200° C. to 400° C.

In accordance with again an added feature of the invention, the polycrystalline aluminum film may be deposited by thermal, inductive, or electron beam vapor deposition.

In accordance with a concomitant feature of the invention, the polycrystalline aluminum film may be deposited on the substrate by a so-called CVD method, for instance with triisobutyl aluminum as the starting substance.

The above-noted process is particularly suitable for forming aluminum conductor tracks with a width $\leq 1$ $\mu$m for an integrated circuit.

Other features which are considered as characteristic for the invention are set forth in the appended claims.

Although the invention is illustrated and described herein as embodied in a method of producing an aluminum film on a substrate, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of a specific example.

EXAMPLE

In both exemplary cases, a polycrystalline aluminum layer, which contains between 0.5 and 5% by weight of copper, is deposited on a substrate, of silicon dioxide, for instance. The deposition is by sputtering, for example.

In addition to the 0.5 to 5% by weight of copper, it is possible to add further additives of metals or metalloids, especially silicon, to the aluminum. Adding approximately 1% by weight of silicon has also proved to be favorable for improvement with respect to electromigration and stress migration. Moreover, the addition of silicon is usual in order to prevent the diffusion of silicon out of the substrate into the aluminum, which is undesirable especially for the contact holes and vias.

Sputtering can be performed at a temperature below 100° C., which achieves a very fine-particle-sized structure with aluminum grain sizes of 50 to 100 nm. Preferably, however, the aluminum film is deposited by sputtering at a substrate temperature of 200° C. to 400° C., so that aluminum grains can be obtained after annealing which are several micrometers in size. The resultant aluminum conductor tracks then have a so-called bamboo structure, since the size of the aluminum grains is now on the order of magnitude of the width of the aluminum conductor tracks themselves.

The state of the art then teaches cooling of the substrate with the sputtered-on and annealed polycrystalline aluminum film.

In the cooling, which previously took place in an uncontrolled manner, so-called Guinier-Preston zones are formed. During the cooling flat copper sediments (islets), i.e., the Guinier-Preston phases, are formed. After that, the copper atoms migrate out of the planes in the interior of the aluminum grains to the particle boundaries. Since the Guinier-Preston phases are unstable, they then migrate into the stable $Al_2Cu$-$\theta$-phases. The escaped copper atoms leave open lattice planes in the aluminum grains, or lattice planes which are severely disturbed by offsets. These planes can then no longer be repaired by aluminum atoms.

Finally, because of the extrinsic strong tensile stresses that occur when integrated circuits are put into operation and used, the individual aluminum grains crack open along gap-shaped cracks, known as slit defects. This results in the ripping of entire aluminum conductor tracks.

According to the present invention the formation of the unstable Guinier-Preston phases after the annealing process is avoided by a defined "alloy maturation process". As a result, the stable $Al_2Cu$-$\theta$-phases are formed directly. This is accomplished by a controlled cooling, in which the instantaneous temperature passes through a predetermined temperature profile in the temperature range from 320° C. to 200° C. The change in the temperature within this temperature range is less than 6° per hour.

The alloy maturation can be shown by determining the specific conductor track resistance, which assumes a minimum after complete alloy maturation. By means of the method of the invention, the service life is increased by at least one-third compared with electromigration and stress migration.

We claim:

1. A method of producing an aluminum film on a substrate, which comprises:
   a) depositing a polycrystalline aluminum film with 0.5 to 5% by weight of copper on a substrate;
   b) placing the substrate with the polycrystalline aluminum film in an oven and heating to a given target temperature;
   c) subsequently cooling the substrate with the polycrystalline aluminum film from the target temperature to a final temperature in a controlled cooling step by causing an instantaneous temperature of the substrate with the polycrystalline aluminum film to pass through a temperature range from 320° C. to 200° C. at a temperature change of less than 6° C. per hour, and directly forming $Al_2Cu$-$\theta$-phases between individual aluminum grains in the polycrystalline aluminum film.

2. The method according to claim 1, wherein the cooling step comprises cooling the substrate and the aluminum film in the oven.

3. The method according to claim 1, which further comprises annealing the substrate with the polycrystalline aluminum film at the target temperature.

4. The method according to claim 1, which further comprises applying an imide film on the aluminum film, and polymerizing the imide film at the target temperature.

5. The method according to claim 1, which comprises defining the target temperature at between 350° C. and 450° C.

6. The method according to claim 1, wherein the step of depositing the polycrystalline aluminum film comprises sputtering at a substrate temperature of 200° C. to 400° C.

7. The method according to claim 1, wherein the step of depositing the polycrystalline aluminum film comprises depositing by thermal vapor deposition.

8. The method according to claim 1, wherein the step of depositing the polycrystalline aluminum film comprises depositing by inductive vapor deposition.

9. The method according to claim 1, wherein the step of depositing the polycrystalline aluminum film comprises depositing by electron beam vapor deposition.

10. The method according to claim 1, wherein the step of depositing the polycrystalline aluminum film comprises depositing by a CVD process.

11. The method according to claim 1, wherein the depositing step comprises forming aluminum conductor tracks with a width $\leq 1$ $\mu$m for an integrated circuit.

12. A method of producing an aluminum film on a substrate, which comprises:
   a) depositing a polycrystalline aluminum film with 0.5 to 5% by weight of copper on a substrate;
   b) placing the substrate with the polycrystalline aluminum film in an oven and heating to a given target temperature;
   c) applying an imide film on the aluminum film and polymerizing the imide film at the target temperature; and
   d) subsequently cooling the substrate with the polycrystalline aluminum film from the target temperature to a final temperature, and directly forming $Al_2Cu$-$\theta$-phases between individual aluminum grains in the polycrystalline aluminum film.

* * * * *